(12) United States Patent
Saito et al.

(10) Patent No.: US 9,559,681 B2
(45) Date of Patent: Jan. 31, 2017

(54) SEMICONDUCTOR INTEGRATED CIRCUIT DEVICE

(71) Applicant: ALPS ELECTRIC CO., LTD., Tokyo (JP)

(72) Inventors: Junichi Saito, Miyagi-ken (JP); Tomoyuki Sawataishi, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/214,078

(22) Filed: Jul. 19, 2016

(65) Prior Publication Data

US 2016/0329886 A1    Nov. 10, 2016

Related U.S. Application Data

(63) Continuation of application No. PCT/JP2014/081063, filed on Nov. 25, 2014.

(30) Foreign Application Priority Data

Jan. 31, 2014   (JP) ................................ 2014-018026

(51) Int. Cl.
| | | |
|---|---|---|
| *H03K 17/082* | (2006.01) | |
| *H03K 17/0812* | (2006.01) | |
| *H01L 27/092* | (2006.01) | |
| *H03K 17/16* | (2006.01) | |
| *H01L 29/78* | (2006.01) | |

(52) U.S. Cl.
CPC ....... *H03K 17/08122* (2013.01); *H01L 27/092* (2013.01); *H01L 29/7817* (2013.01); *H03K 17/0822* (2013.01); *H03K 17/161* (2013.01)

(58) Field of Classification Search
CPC ............... H03K 17/08122; H03K 17/0822; H03K 17/161; H01L 27/092; H01L 29/7817

See application file for complete search history.

(56) References Cited

U.S. PATENT DOCUMENTS

| | | |
|---|---|---|
| 5,126,911 A | 6/1992 | Contiero et al. |
| 6,292,341 B1 | 9/2001 | Milanesi et al. |

(Continued)

FOREIGN PATENT DOCUMENTS

| | | |
|---|---|---|
| CN | 103515946 A | 1/2014 |
| EP | 0360991 A2 | 4/1990 |

(Continued)

OTHER PUBLICATIONS

International Search Report to International Patent Application No. PCT/JP2014/081063, dated Feb. 24, 2015, 5 pages.

*Primary Examiner* — Patrick O'Neill
(74) *Attorney, Agent, or Firm* — Brinks Gilson & Lione

(57) ABSTRACT

A semiconductor integrated circuit device is configured such that if, due to an erroneous connection or the like, an abnormal state is entered in which an output voltage is lower than a ground potential VSS, an N-type DMOS transistor and a first P-type MOS transistor are turned off and a voltage is applied to their parasitic diodes in the opposite direction, preventing a current from flowing. In a normal state in which the output voltage is higher than the ground potential, at least one of the N-type DMOS transistor and first P-type MOS transistor, which are connected in parallel, is turned on, preventing a current from flowing into the parasitic diode of the N-type DMOS transistor.

5 Claims, 4 Drawing Sheets

(56) References Cited

U.S. PATENT DOCUMENTS

| | | | | |
|---|---|---|---|---|
| 6,650,520 | B2* | 11/2003 | He | H02H 11/003 307/127 |
| 7,911,260 | B2* | 3/2011 | Petruzzi | H03K 17/0822 327/535 |
| 8,013,475 | B2* | 9/2011 | Wotruba | H01L 27/0266 307/130 |
| 9,001,481 | B2* | 4/2015 | Sawataishi | H03K 19/00315 361/77 |
| 9,374,074 | B2* | 6/2016 | Saito | H03K 5/1532 |
| 2012/0175730 | A1 | 7/2012 | Stecher | |
| 2014/0002936 | A1 | 1/2014 | Sawataishi et al. | |

FOREIGN PATENT DOCUMENTS

| | | |
|---|---|---|
| EP | 0954079 A1 | 11/1998 |
| EP | 2680439 A2 | 1/2014 |
| IT | 1227104 B | 3/1991 |
| JP | H 02122665 A | 5/1990 |
| JP | 11191595 A | 7/1999 |
| JP | 2000058756 A | 2/2000 |
| JP | 2014011233 A | 1/2014 |

* cited by examiner

US 9,559,681 B2

SEMICONDUCTOR INTEGRATED CIRCUIT DEVICE

CLAIM OF PRIORITY

This application is a Continuation of International Application No. PCT/JP2014/081063 filed on Nov. 25, 2014, which claims benefit of priority to Japanese Patent Application No. 2014-018026 filed on Jan. 31, 2014. The entire contents of each application noted above are hereby incorporated by reference.

BACKGROUND

1. Field of the Disclosure

The present disclosure relates to a semiconductor integrated circuit device equipped with an output terminal for use for a signal, and more particularly to a semiconductor integrated circuit device that can protect an internal circuit even if a voltage lower than the ground is applied to the output terminal.

2. Description of the Related Art

An integrated circuit (IC) having a sensing function is generally equipped with power supply terminals (+ terminal and − terminal) used to supply electric power from the outside and with an output terminal used to output a sensing signal. If a senor module is installed at a place distant from a controller, these terminals are usually connected to the controller through a cable. Therefore, a power supply line may be connected to the signal output terminal of the IC by mistake due to a miss in cable wiring or the like. In this case, an excessive current may flow into the interior of the IC.

FIG. 4 illustrates a general open drain type of signal output circuit. The signal output circuit illustrated in FIG. 4 is comprised of an N-type MOS transistor 51. With the MOS transistor 51, a source is connected to a ground terminal T1, a drain is connected to an output terminal T2, and a gate accepts a signal IN_B. This output terminal T2 is connected to an external power supply voltage 53 through a pull-up resistor 52. If the MOS transistor 51 is turned off, a voltage VOUT at the output terminal T2 is at a high level; if the MOS transistor 51 is turned on, the voltage VOUT at the output terminal T2 is at a low level. In general, since the output terminal T2 is connected to the external power supply voltage 53 through the pull-up resistor 52, the voltage VOUT at the output terminal T2 will not fall below a ground potential VSS. If there is an erroneous cable connection or the like, however, there may be a case in which the voltage VOUT falls below the ground potential VSS.

FIG. 5 illustrates a case in which, in the signal output circuit illustrated in FIG. 4, the voltage VOUT at the output terminal T2 falls below the ground potential VSS. In the example in FIG. 5, a signal line, which should be connected to the output terminal T2, is connected to the ground terminal T1, and a power supply line on a low voltage side, which should be connected to the ground terminal T1, is connected to the output terminal T2. In this case, a current flows from the ground terminal T1 through a parasitic diode of the MOS transistor 51 to the output terminal T2, as indicated by the dash-dot line.

FIGS. 6A and 6B are drawings to explain a parasitic diode of an N-type MOS transistor 51. FIG. 6A illustrates the structure of the MOS transistor 51, and FIG. 6B illustrates a current flowing into the parasitic diode. When potentials at the source S and bulk B become higher than a potential at the drain D, the parasitic diode present between the bulk (P-well) and the drain of the N-type MOS transistor 51 is brought into conduction, so a current flows as indicated by the dash-dot line in the drawing. When a current flows into the parasitic diode, the circuit becomes unstable and an electric power loss occurs in the parasitic diode.

A possible method used to prevent a current from flowing into a parasitic diode of a MOS transistor is to, for example, insert a diode in the opposite direction from the parasitic diode into a current path separately. However, another problem arises in that a voltage drop or an electric power loss occurs in the diode in a normal operation state. In view of this, Japanese Unexamined Patent Application Publication No. 2000-58756 proposes a method in which an N-type MOS transistor for use for reverse current prevention is provided in series with an N-type MOS transistor for use for signal output.

FIG. 7 illustrates a conventional protection circuit described in Japanese Unexamined Patent Application Publication No. 2000-58756 above. In this protection circuit, a double-diffused metal-oxide-semiconductor (DMOS) transistor MP is provided in series with an N-type DMOS MI for use for signal output.

If an output voltage VOUT is higher than the ground potential VSS, an output signal from a comparator 63 is at the high level. When a high-level signal IN_B is input to the gate of the DMOS transistor MI, the DMOS transistor MI is turned on. When the signal IN_B goes high, an output from an AND circuit 64 goes high and a current flows from a current source 61 into a resistor 62, so the gate of the DMOS transistor MP goes high and the DMOS transistor MP is also turned on. Accordingly, the DMOS transistors MI and MP are both turned on and the output voltage VOUT goes low. Since the channel of the DMOS transistor MP is brought into conduction, a current does not flow into the parasitic diode of the DMOS transistor MP, so an electric power loss does not occur in the parasitic diode.

By contrast, if the output voltage VOUT falls below the ground potential VSS due to an erroneous connection or the like, the output from the comparator 63 goes low and the output from the AND circuit 64 is kept at the low level, so a current does not flow from a current source 61 into the resistor 62. Therefore, the DMOS transistor MP is held in an off state. The parasitic diode of the DMOS transistor MI is in the forward direction with respect to the current flowing from the ground potential VSS to the output terminal. Since the parasitic diode of the DMOS transistor MP is in the opposite direction, however, a reverse current does not flow from the ground terminal to the output terminal.

As described above, the protection circuit illustrated in FIG. 7 can prevent a reverse current due to an erroneous connection or the like. However, if the output terminal is pulled up to a voltage almost equal to a power supply voltage VCC during a normal operation in which there is no erroneous connection, the output voltage VOUT approaches the power supply voltage VCC in a state in which the DMOS transistor MI is turned off and the gate-source voltage of the DMOS transistor MP becomes almost zero, so the DMOS transistor MP is turned off. In this case, when the DMOS transistor MI changes from off to on, a forward current flows into the parasitic diode of the DMOS transistor MP, so an unnecessary electric power loss occurs in the parasitic diode. If the temperature of the IC chip is raised due to heat generated in the parasitic diode, characteristic deterioration and other problems are caused.

SUMMARY

A semiconductor integrated circuit device includes: an output terminal used to output a signal; a first switching circuit provided in a current path between the output terminal and a first power supply line, the first switching circuit being turned on or off according to an input signal; an N-type DMOS transistor provided in a current path between the output terminal and the first switching circuit, the N-type DMOS transistor having a source connected to the output terminal, a drain connected to the first switching circuit, and a gate, the N-type DMOS transistor being turned on when a potential at the gate becomes higher than a potential at the source by more than a threshold voltage; a second switching circuit connected in parallel to the N-type DMOS transistor, the second switching circuit being turned on when a voltage at the output terminal with respect to a potential in the first power supply line becomes higher than a positive first voltage; and a control circuit that sets a voltage at the gate of the N-type DMOS transistor with respect to the potential in the first power supply line to a second voltage that is higher than the first voltage by more than the threshold voltage when a potential at the output terminal is higher than the potential in the first power supply line, and sets the voltage at the gate of the N-type DMOS transistor with respect to the potential at the output terminal to a voltage lower than the threshold voltage when the potential at the output terminal is lower than the potential in the first power supply line.

According to the structure described above, if the potential at the output terminal falls below the potential in the first power supply line due to an erroneous connection or the like, the voltage at the gate of the N-type DMOS transistor with respect to the potential at the output terminal is set to a voltage lower than the threshold voltage by the control circuit, so the N-type DMOS transistor is turned off. In addition, since the voltage at the output terminal with respect to the potential in the first power supply line (sometimes, the voltage will be referred to below as the output voltage) falls below the first voltage, the second switching circuit is also turned off. Accordingly, the current path between the output terminal and the first power line is interrupted, so a reverse current does not flow into the current path.

In addition, according to the structure described above, when the potential at the output terminal is higher than the potential in the first power supply line, the voltage at the gate of the N-type DMOS transistor with respect to the potential in the first power supply line is set to the second voltage by the control circuit. The second voltage is a voltage that is higher than the first voltage by more than the threshold voltage.

In this case, if the output voltage approaches the second voltage or becomes higher than the second voltage, the potential at the gate of the N-type DMOS transistor falls below the potential at the source by more than the threshold voltage, so the N-type DMOS transistor is turned off. By contrast, the second switching circuit is turned on because the output voltage becomes higher than the first voltage.

If the output voltage drops below the second voltage and the amount of drop reaches the threshold voltage, the potential at the gate of the N-type DMOS transistor becomes higher than the potential at the source by more than the threshold voltage, so the N-type DMOS transistor is turned on. At that time, since the second voltage is a voltage that is higher than the first voltage by more than the threshold voltage, the output voltage becomes higher than the first voltage. Therefore, the second switching circuit continues to be turned on.

If the output voltage is further lowered and falls below the first voltage, the second switching circuit is turned off. At that time, since the potential at the gate of the N-type DMOS transistor is higher than the potential at the source by more than the threshold voltage, so the N-type DMOS transistor continues to be turned on.

Accordingly, if the potential at the output terminal is higher than the potential in the first power supply line, at least one of the N-type DMOS transistor and the second switching circuit is turned on. Accordingly, if the first switching circuit is turned on and a current flows from the output terminal to the first power supply line, this current flows into at least one of the N-type DMOS transistor and the second switching circuit. Therefore, almost no current flows into the parasitic . diode present between the bulk and drain of the N-type DMOS transistor.

DESCRIPTION OF THE EXEMPLARY EMBODIMENTS

First embodiment

A semiconductor integrated circuit device according to a first embodiment of the present invention will be described below with reference to the drawings.

Figure 1:
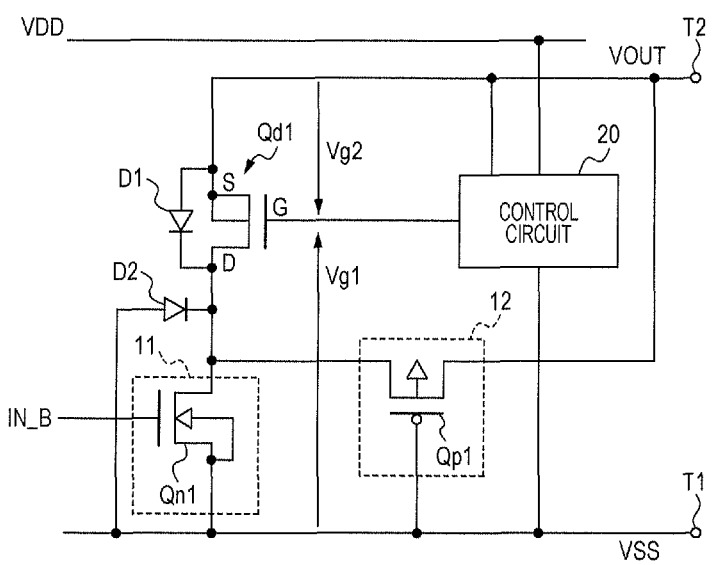
FIG. 1 illustrates an example of the structure of a semiconductor integrated circuit device according to a first embodiment.

FIG. 1 illustrates an example of the structure of the semiconductor integrated circuit device according to the first embodiment. The semiconductor integrated circuit device illustrated in FIG. 1 has a ground terminal T1, an output terminal T2, a first switching circuit 11, a second switching circuit 12, an N-type DMOS transistor Qd1, and a control circuit 20.

The output terminal T2, which is a terminal used to output a signal to the outside, is connected to a device at a signal output destination through a signal line (not illustrated). In the device at the signal output destination, the signal line is connected to a power supply line (VDD) through, for example, a pull-up resistor.

The ground terminal T1 is connected to the ground (VSS) of the device at the signal output destination through a signal line (not illustrated).

The first switching circuit 11, which is a circuit that generates an output voltage VOUT according to an input signal IN_B, is provided in a current path between the output terminal T2 and the ground. The first switching circuit 11 is turned on or off according to the input signal IN_B. Here, the term ground indicates a power supply line, on a low-voltage side, that is connected to the ground terminal T1; the ground corresponds to a first power supply line in the present invention.

The first switching circuit 11 is comprised of an N-type MOS transistor Qn1 as illustrated in, for example, FIG. 1. With the N-type MOS transistor Qn1, a source is connected to the ground, a drain is connected to the output terminal T2 through the N-type DMOS transistor Qd1, and a gate accepts the input signal IN_B. The N-type MOS transistor Qn1 is turned on when the input signal IN_B is at a high level and is turned off when the input signal IN_B is at a low level.

The N-type DMOS transistor Qd1 is provided in a current path between the first switching circuit 11 and the output terminal T2; a source is connected to the output terminal T2, and a drain is connected to the first switching circuit 11. The N-type DMOS transistor Qd1 is turned on when a potential at the gate becomes higher than a potential at the source by more than a threshold voltage Vth, and is turned off when the potential at the gate becomes higher than the threshold voltage Vth.

Figure 2A:
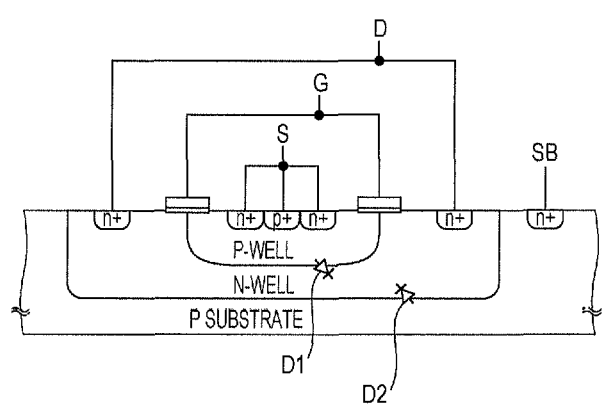
FIGS. 2A and 2B illustrate an example of the structure of an N-type DMOS transistor, FIG. 2A illustrating the cross-sectional structure of the N-type DMOS transistor, FIG. 2B illustrating its equivalent circuit.
Figure 2B:
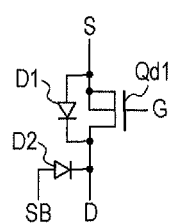

FIGS. 2A and 2B illustrate an example of the structure of the N-type DMOS transistor Qd1. FIG. 2A indicates the cross-sectional structure of the N-type DMOS transistor Qd1, and FIG. 2B indicates its equivalent circuit. An N-type diffusion area (N-well) is formed on a surface of a P-type substrate, and a P-type diffusion area (P-well) is formed in the N-well. N-type diffusion areas (N+), which become a source, are formed in the P-well, and a P-type diffusion area (P+), which is used to bring the source and P-well into conduction with each other, is formed between the N-type diffusion areas. On a boundary between the P-well and N-well on the surface of the P-type substrate, a gate electrode is formed through an insulating film. N-type diffusion areas (N+), which are used to bring the drain and N-well into conduction with each other, are formed in the area of the N-well on the surface of the P-type substrate.

A parasitic diode D1 is formed on a boundary between the P-well and the N-well. The anode of the parasitic diode D1 is connected to the source through the P-well, and the cathode of the parasitic diode D1 is connected to the drain through the N-well.

A parasitic diode D2 is formed on a boundary between the N-well and the P-type substrate. The anode of the parasitic diode D2 is connected to the P-type substrate, and the cathode of the parasitic diode D2 is connected to the drain through the N-well. Since, in the example in FIG. 2A, the P-type substrate is connected to the ground, the anode of the parasitic diode D2 is connected to the ground.

FIG. 1 will be referenced again.

The second switching circuit 12 is connected in parallel to the N-type DMOS transistor Qd1. The second switching circuit 12 is turned on when the output voltage VOUT at the output terminal T2 with respect to the ground potential VSS becomes higher than a positive first voltage V1 and is turned off when the output voltage VOUT falls below the positive first voltage V1.

For example, the second switching circuit 12 is preferably comprised of a first P-type MOS transistor Qp1 as illustrated in FIG. 1. With the first P-type MOS transistor Qp1, a source is preferably connected to the output terminal T2, a drain is preferably connected to the first switching circuit 11, and a gate is preferably connected to the ground. The bulk of the first P-type MOS transistor Qp1 is connected to an appropriate potential (for example, a power supply voltage VDD). The output voltage VOUT becomes equal to the gate-source voltage of the first P-type MOS transistor Qp1. The first P-type MOS transistor Qp1 is turned on when this output voltage VOUT becomes higher than the first voltage V1, and is turned off when the output voltage VOUT falls below the first voltage V1. The first voltage V1 is equivalent to a threshold voltage for the gate-source voltage of the first P-type MOS transistor Qp1.

The control circuit 20 controls the gate voltage of the N-type DMOS transistor Qd1 according to the potential at the output terminal T2. If the potential at the output terminal T2 is higher than the ground potential VSS (if the output voltage VOUT is a positive voltage), the control circuit 20 sets a voltage Vg1 at the gate of the N-type DMOS transistor Qd1 with respect to the ground potential VSS to a second voltage V2. The second voltage V2 is a voltage that is higher than the first voltage V1 by more than the threshold voltage Vth (V2>V1+Vth). For example, the control circuit 20 applies the VDD that is sufficiently higher than "V1 +Vth" to the gate of the N-type DMOS transistor Qd1 as the second voltage V2.

By contrast, if the potential at the output terminal T2 is lower than the ground potential VSS (if the output voltage VOUT is a negative voltage), the control circuit 20 sets a voltage Vg2 at the gate of the N-type DMOS transistor Qd1 with respect to the potential at the output terminal T2 to a voltage lower than the threshold voltage Vth so as to turn off the N-type DMOS transistor Qd1.

Here, operations of the semiconductor integrated circuit device having the structure described above will be described.

First, an operation in a normal state, in which the output voltage VOUT is higher than the ground potential VSS will be described. The output terminal T2 will be assumed to have been pulled up to the power supply voltage VDD by a pull-up resistor (not illustrated). When the input signal IN_B at the low level is input to the gate of the N-type MOS transistor Qn1, the N-type MOS transistor Qn1 is turned off, so the current path from the output terminal T2 to the ground is interrupted, making the output voltage VOUT at the output terminal T2 almost equal to the power supply voltage VDD. Since the output voltage VOUT has been set to a potential higher than the ground potential VSS, the control circuit 20 sets the gate voltage Vg1 of the N-type DMOS transistor Qd1 to the power supply voltage VDD. Since the voltages at the gate and source of the N-type DMOS transistor Qd1 become almost the same voltage (VDD), the N-type DMOS transistor Qd1 is turned off. By contrast, a voltage (VOUT) between the gate and source of the first P-type MOS transistor Qp1 becomes higher than the first voltage V1, so the first P-type MOS transistor Qp1 is turned on.

When the input signal IN_B changes from the low level to the high level, the N-type MOS transistor Qn1 is turned on. If the output voltage VOUT is close to the power supply voltage VDD, the N-type DMOS transistor Qd1 is in the off state and the first P-type MOS transistor Qp1 is in the off state, so a current flows from the output terminal T2 through the first P-type MOS transistor Qp1 and N-type MOS transistor Qn1 to the ground. Since both ends of the parasitic diode D1 of the N-type DMOS transistor Qd1 is short-circuited by the first P-type MOS transistor Qp1, almost no current flows into the parasitic diode D1.

When a current flows from the output terminal T2 to the ground, a voltage drop occurs in the pull-up resistor (not illustrated) and the output voltage VOUT at the output terminal T2 is lowered from the power supply voltage VDD. When the output voltage VOUT is lowered from the power supply voltage VDD, the gate-source voltage Vg2 of the N-type DMOS transistor Qd1 is raised. When the voltage Vg2 is raised and exceeds the threshold voltage Vth for the N-type DMOS transistor Qd1, the N-type DMOS transistor Qd1 is turned on.

When the gate-source voltage Vg2 of the N-type DMOS transistor Qd1 reaches the threshold voltage Vth, the output voltage VOUT becomes "VDD−Vth". Here, the power supply voltage VDD applied to the gate of the N-type DMOS transistor Qd1 by the control circuit 20 is a voltage (VDD>V1+Vth) that is sufficiently higher than "V1+Vth". Therefore, "VDD−Vth" becomes sufficiently higher than the first voltage V1 (VDD−Vth>V1). Therefore, even if the output voltage VOUT is lowered to "VDD−Vth", the first P-type MOS transistor Qp1 continues to be turned on. That is, both the N-type DMOS transistor Qd1 and N-type MOS transistor Qn1 are both turned on and the output terminal T2 and ground are short-circuited by transistors (Qd1, Qp1, and QM). In addition, since the N-type DMOS transistor Qd1 and first P-type MOS transistor Qp1 are in the on state, almost no current flows into the parasitic diode D1 of the N-type DMOS transistor Qd1.

If the output voltage VOUT is further lowered due to the voltage drop in the pull-up resistor (not illustrated) and falls below the first voltage V1, which is the threshold voltage for the first P-type MOS transistor Qp1, the first P-type MOS transistor Qp1 is turned off. By contrast, the gate-source voltage Vg2 of the N-type DMOS transistor Qd1 is further raised due to the lowering of the output voltage VOUT, so the N-type DMOS transistor Qd1 continues to be turned on. Therefore, the output terminal T2 and ground are short-circuited by transistors (Qd1 and Qn1). Since the N-type DMOS transistor Qd1 is in the on state, almost no current flows into the parasitic diode D1 of the N-type DMOS transistor Qd1.

As described above, when the N-type MOS transistor Qn1 is turned on, a current does not flow into the parasitic diode D1 and the output voltage VOUT is lowered from the power supply voltage VDD nearly to the ground potential VSS.

Next, an operation in an abnormal state in which the output voltage VOUT is lower than the ground potential VSS will be described. In this case, since the gate-source voltage of the first P-type MOS transistor Qp1 falls below the threshold voltage (first voltage V1), the first P-type MOS transistor Qp1 is turned off. In addition, since the control circuit 20 sets the voltage Vg2 at the gate of the N-type DMOS transistor Qd1 with respect to the potential at the output terminal T2 to a voltage (for example, zero) lower than the threshold voltage Vth, the N-type DMOS transistor Qd1 is also turned off. When the output voltage VOUT falls below the ground potential VSS, a voltage is applied in the opposite direction to the parasitic diode D1 of the N-type DMOS transistor Qd1, preventing a current from flowing. In addition, the power supply voltage VDD is applied to the bulk of the first P-type MOS transistor Qp1, a voltage is applied in the opposite direction to the parasitic diode of the first P-type MOS transistor Qp1 as well, preventing a current from flowing. Therefore, all current paths between the ground and the output terminal T2 are interrupted, so a reverse current does not flow from the ground to the output terminal T2.

As described above, according to the semiconductor integrated circuit device in this embodiment, if, due to an erroneous connection or the like, an abnormal state is entered in which the output voltage VOUT is lower than the ground potential VSS, the N-type DMOS transistor Qd1 and first P-type MOS transistor Qp1 are turned off and a voltage is applied to their parasitic diodes in the opposite direction, preventing a current from flowing. Accordingly, it is possible to reliably prevent a flow of a reverse current from the ground to the output terminal T2.

According to the semiconductor integrated circuit device in this embodiment, in a normal state in which the output voltage VOUT is higher than the ground potential VSS, the power supply voltage VDD higher than "V1+Vth" is applied to the gate of the N-type DMOS transistor Qd1. If the output voltage VOUT is higher than the first voltage V1 (VOUT>V1), the first P-type MOS transistor Qp1 is turned on. If the output voltage VOUT is lower than "VDD−Vth" (VDD−Vth>VOUT), the N-type DMOS transistor Qd1 is turned on. If the output voltage VOUT is lower than "VDD−Vth" and higher than the first voltage V1 (VDD−Vth>VOUT >V1), both the N-type DMOS transistor Qd1 and first P-type MOS transistor Qp1 are turned on. That is, at least one of the N-type DMOS transistor Qd1 and first P-type MOS transistor Qp1, which are connected in parallel, is turned on, so a current does not flow into the parasitic diode D1 of the N-type DMOS transistor Qd1. Therefore, it is possible to suppress an unnecessary electric power loss in the parasitic diode D1 and prevent deterioration in circuit characteristics and the like due to generated heat.

Second embodiment

Next, a second embodiment of the present invention will be described.

Figure 3:
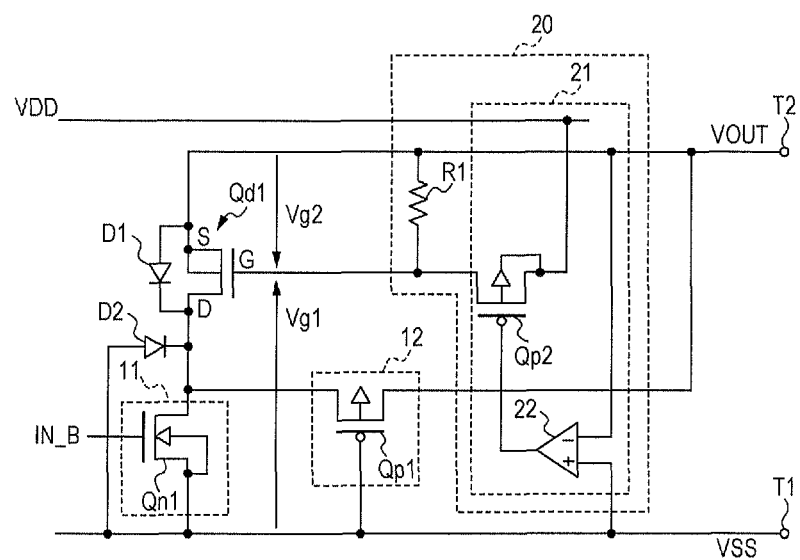
FIG. 3 illustrates an example of the structure of a semiconductor integrated circuit device according to a second embodiment.
Figure 4:
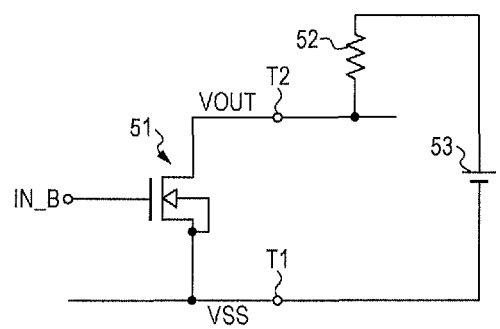
FIG. 4 illustrates a general open drain type of signal output circuit.
Figure 5:
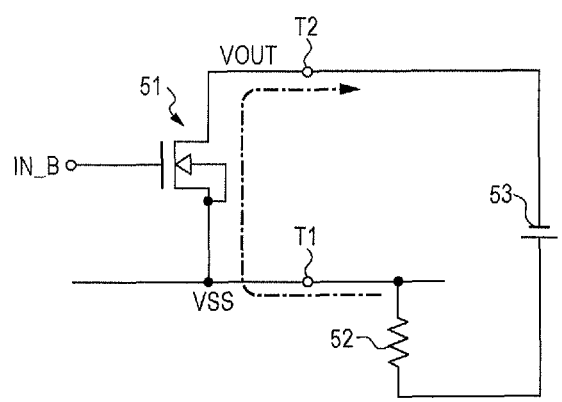
FIG. 5 illustrates a case in which, in the signal output circuit illustrated in FIG. 4, a potential at the output terminal falls below a ground potential.
Figure 6A:
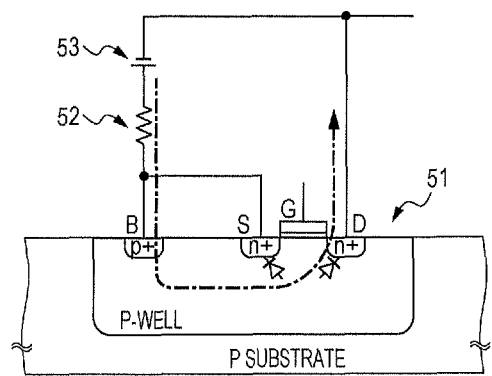
FIGS. 6A and 6B are drawings to explain a parasitic diode of an N-type MOS transistor, FIG. 6A illustrating the structure of the MOS transistor, FIG. 6B illustrating a current flowing into the parasitic diode.
Figure 6B:
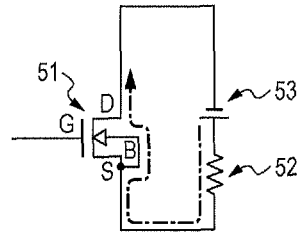
Figure 7:
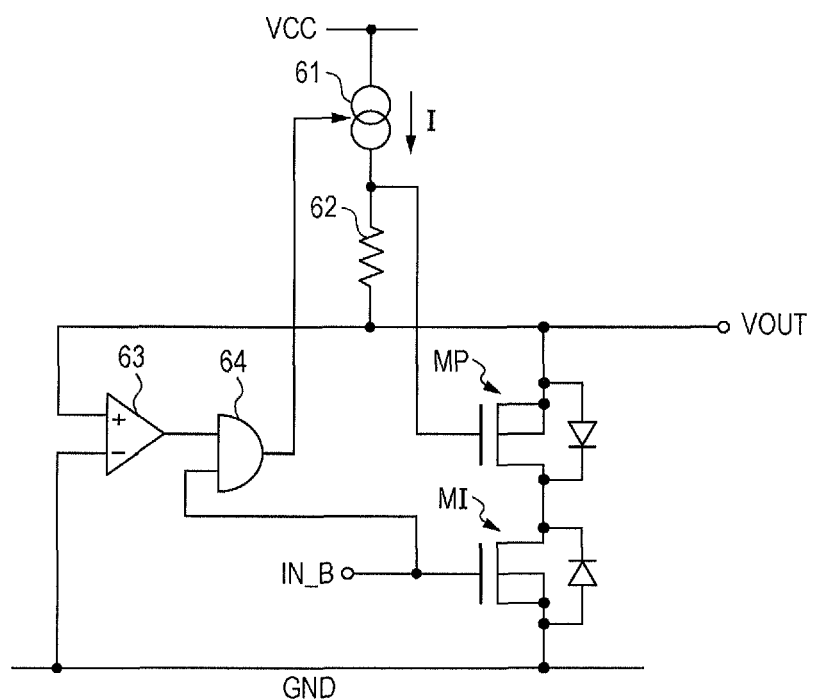
FIG. 7 illustrates a conventional protection circuit.

FIG. 3 illustrates an example of the structure of a semiconductor integrated circuit device according to the second embodiment. The semiconductor integrated circuit device according to this embodiment is a crystallization of the structure of the control circuit 20 in the semiconductor integrated circuit device illustrated in FIG. 1; in other respects, the structure of the semiconductor integrated circuit device in the second embodiment is the same as in the semiconductor integrated circuit device illustrated in FIG. 1.

In the semiconductor integrated circuit device illustrated in FIG. 3, the control circuit 20 preferably has a resistor R1 connected between the gate and source of the N-type DMOS transistor Qd1 and a voltage output circuit 21. The voltage output circuit 21 preferably outputs the power supply voltage VDD to the gate of the N-type DMOS transistor Qd1 as the second voltage V2 (V2>V1+Vth) in the normal state in which the output voltage VOUT is higher than the ground potential VSS. In the abnormal state in which the output voltage VOUT is lower than the ground potential VSS, the voltage output circuit 21 preferably places an output impedance in a high-impedance state.

The voltage output circuit 21 preferably has a second P-type MOS transistor Qp2 and a comparison circuit 22 as illustrated in, for example, FIG. 3.

The second P-type MOS transistor Qp2 is preferably connected between the power supply line (second power supply line) of the power supply voltage VDD and the gate of the N-type DMOS transistor Qd1. The power supply voltage VDD is applied to the bulk of the second P-type MOS transistor Qp2.

The comparison circuit 22 preferably makes a comparison between the output voltage VOUT and the ground potential VSS. If the output voltage VOUT is higher than the ground potential VSS, the comparison circuit 22 preferably outputs a low-level voltage (for example, the ground potential VSS) that turns on the second P-type MOS transistor Qp2. If the output voltage VOUT is lower than the ground potential VSS, the comparison circuit 22 preferably outputs a high-level voltage (for example, the power supply voltage VDD) that turns off the second P-type MOS transistor Qp2.

According to the above structure, if, due to an erroneous connection or the like, the abnormal state is entered in which the output voltage VOUT is lower than the ground potential VSS, the second P-type MOS transistor Qp2 connected between the power supply line of the power supply voltage VDD and the gate of the N-type DMOS transistor Qd1 is turned off and the output from the voltage output circuit 21 is thereby placed in the high-impedance state, so the gate of the N-type DMOS transistor Qd1 is connected to the output terminal T2 through the resistor R1. Accordingly, the gate and source of the N-type DMOS transistor Qd1 have almost the same potential and the N-type DMOS transistor Qd1 is turned off. Therefore, due to an operation similar to that of the semiconductor integrated circuit device, in FIG. 1, that has been already described, it is possible to prevent a flow of a reverse current from the ground to the output terminal T2.

In the normal state in which the output voltage VOUT is higher than the ground potential VSS, the second P-type MOS transistor Qp2 is turned on and the power supply voltage VDD is applied to the gate of the N-type DMOS transistor Qd1. Therefore, due to an operation similar to that of the semiconductor integrated circuit device, in FIG. 1, that has been already described, at least one of the N-type DMOS transistor Qd1 and first P-type MOS transistor Qp1, which are connected in parallel, is turned on. Therefore, it is possible to suppress an unnecessary electric power loss, which would otherwise be caused by a current flowing into the parasitic diode D1.

So far, some embodiments of the present invention have been described. However, the present invention is not limited only to the embodiments described above and includes various variations.

For example, although, in the semiconductor integrated circuit devices illustrated in FIGS. 1 and 3, an N-type MOS transistor (Qn1) is used as the first switching circuit 11, this is not a limitation on the present invention. Other types of switching elements may be used. In addition, although, in the semiconductor integrated circuit devices illustrated in FIGS. 1 and 3, a P-type MOS transistor (Qp1) is used as the second switching circuit 12, other types of switching elements may be used under the conditions that they are turned on when the output voltage VOUT becomes higher than the predetermined first voltage V1 and are turned off when the output voltage VOUT falls below the predetermined first voltage V1 and that a reverse current does not flow from the ground to the output terminal T2.

Each of the transistors (Qd1, Qn1, and Qp1) provided in the current paths between the output terminal T2 and the ground may be a single transistor. Alternatively, each of the transistors may be replaced with a plurality of transistors of the same type that are connected in parallel to match the current capacity or the convenience of the layout.

What is claimed is:

1. A semiconductor integrated circuit device comprising:
   an output terminal that outputs a signal;
   a first power supply line;
   a current path between the output terminal and the first power supply line;
   a first switching circuit provided in the current path between the output terminal and the first power supply line, the first switching circuit being turned on or off according to an input signal;
   a current path between the output terminal and the first switching circuit:
   an N-type DMOS transistor provided in the current path between the output terminal and the first switching circuit, the N-type DMOS transistor having a source connected to the output terminal, a drain connected to the first switching circuit, and a gate, the N-type DMOS transistor being turned on when a potential at the gate becomes higher than a potential at the source by more than a threshold voltage;
   a second switching circuit connected in parallel to the N-type DMOS transistor, the second switching circuit being turned on when a voltage at the output terminal with respect to a potential in the first power supply line becomes higher than a positive first voltage; and
   a control circuit that sets a voltage at the gate of the N-type DMOS transistor with respect to the potential in the first power supply line to a second voltage that is higher than the first voltage by more than the threshold voltage when a potential at the output terminal is higher than the potential in the first power supply line, and sets the voltage at the gate of the N-type DMOS transistor with respect to the potential at the output terminal to a voltage lower than the threshold voltage when the potential at the output terminal is lower than the potential in the first power supply line.

2. The semiconductor integrated circuit device according to claim 1, wherein the second switching circuit includes a first P-type MOS transistor that have a source connected to the output terminal, a drain connected to the first switching circuit, and a gate connected to the first power supply line.

3. The semiconductor integrated circuit device according to claim 2, wherein the control circuit includes
   a resistor connected between the gate and source of the N-type DMOS transistor, and
   a voltage output circuit that outputs the second voltage to the gate of the N-type DMOS transistor when the potential at the output terminal is higher than the potential in the first power supply line and places an output impedance in a high-impedance state when the output terminal is at a potential lower than the potential in the first power supply line.

4. The semiconductor integrated circuit device according to claim 3, further comprising a second power supply line that has the second voltage with respect to the first power supply line, wherein:
   the voltage output circuit includes
   a second P-type MOS transistor connected between the second power supply line and the gate of the N-type DMOS transistor, and
   a comparison circuit that makes a comparison between the voltage at the output terminal and the potential in the first power supply line and outputs a voltage to the gate of the second P-type MOS transistor, the voltage turning on or off the second P-type MOS transistor according to a result of the comparison.

5. The semiconductor integrated circuit device according to claim 4, wherein an N-type well of the first P-type MOS transistor and an N-type well of the second P-type MOS transistor are connected to the second power supply line.

* * * * *